(12) United States Patent
Wan et al.

(10) Patent No.: US 8,669,539 B2
(45) Date of Patent: *Mar. 11, 2014

(54) IMPLANT METHOD AND IMPLANTER BY USING A VARIABLE APERTURE

(75) Inventors: Zhimin Wan, Sunnyvale, CA (US);
John D. Pollock, Rowley, MA (US);
Don Berrian, Topsfield, MA (US);
Causon Ko-Chuan Jen, San Jose, CA (US)

(73) Assignee: Advanced Ion Beam Technology, Inc., San Jose, CA (US)

( * ) Notice: Subject to any disclaimer, the term of this patent is extended or adjusted under 35 U.S.C. 154(b) by 111 days.

This patent is subject to a terminal disclaimer.

(21) Appl. No.: 12/748,877

(22) Filed: Mar. 29, 2010

(65) Prior Publication Data

US 2011/0233431 A1 Sep. 29, 2011

(51) Int. Cl.
*H01J 37/317* (2006.01)
*H01J 37/02* (2006.01)

(52) U.S. Cl.
USPC .............................. 250/492.23; 250/492.22

(58) Field of Classification Search
USPC ........ 250/492.22, 492.23, 492.3, 398, 492.21
See application file for complete search history.

(56) References Cited

U.S. PATENT DOCUMENTS

| | | | |
|---|---|---|---|
| 4,943,728 A * | 7/1990 | Dykstra et al. ............. 250/492.3 |
| 6,194,734 B1 * | 2/2001 | Loomis et al. ........... 250/492.21 |
| 6,207,964 B1 * | 3/2001 | McIntyre et al. ........ 250/492.21 |
| 6,537,606 B2 * | 3/2003 | Allen et al. ........................ 427/9 |
| 6,791,097 B2 * | 9/2004 | Scheuer et al. .......... 250/492.21 |
| 6,828,572 B2 * | 12/2004 | Reece et al. ............. 250/492.21 |
| 7,279,687 B2 * | 10/2007 | Angel et al. .............. 250/396 R |
| 7,442,946 B2 * | 10/2008 | Lee ........................... 250/492.21 |
| 7,675,047 B2 * | 3/2010 | Radovanov et al. ..... 250/492.21 |
| 7,750,323 B1 * | 7/2010 | Wan et al. ................ 250/492.21 |
| 8,017,922 B2 * | 9/2011 | Matsumoto et al. ..... 250/492.21 |
| 8,198,610 B2 * | 6/2012 | McRay .................... 250/492.21 |
| 2002/0121613 A1 * | 9/2002 | Scheuer et al. ............ 250/492.1 |
| 2002/0126268 A1 * | 9/2002 | Matsumoto et al. ............ 355/67 |
| 2006/0228634 A1 * | 10/2006 | Bret et al. ......................... 430/5 |
| 2007/0023696 A1 * | 2/2007 | Lee ........................... 250/492.21 |
| 2007/0045557 A1 * | 3/2007 | Angel et al. .............. 250/396 R |
| 2007/0155028 A1 * | 7/2007 | Jang et al. ........................ 438/14 |

(Continued)

FOREIGN PATENT DOCUMENTS

| | | |
|---|---|---|
| CN | 1535470 A | 10/2004 |
| JP | 7-312193 A | 11/1995 |

(Continued)

*Primary Examiner* — David A Vanore
*Assistant Examiner* — Wyatt Stoffa
(74) *Attorney, Agent, or Firm* — Morrison & Foerster LLP

(57) ABSTRACT

A variable aperture within an aperture device is used to shape the ion beam before the substrate is implanted by shaped ion beam, especially to finally shape the ion beam in a position right in front of the substrate. Hence, different portions of a substrate, or different substrates, can be implanted respectively by different shaped ion beams without going through using multiple fixed apertures or retuning the ion beam each time. In other words, different implantations may be achieved respectively by customized ion beams without high cost (use multiple fixed aperture devices) and complex operation (retuning the ion beam each time). Moreover, the beam tune process for acquiring a specific ion beam to be implanted may be accelerated, to be faster than using multiple fixed aperture (s) and/or retuning the ion beam each time, because the adjustment of the variable aperture may be achieved simply by mechanical operation.

19 Claims, 12 Drawing Sheets

(56) References Cited

U.S. PATENT DOCUMENTS

| | | | |
|---|---|---|---|
| 2008/0054196 A1* | 3/2008 | Hiroshima | 250/492.23 |
| 2008/0173828 A1* | 7/2008 | Ohno et al. | 250/396 ML |
| 2009/0032725 A1* | 2/2009 | Hautala | 250/492.21 |
| 2009/0321632 A1* | 12/2009 | Grant et al. | 250/288 |
| 2010/0243920 A1* | 9/2010 | Hautala et al. | 250/492.3 |
| 2011/0049383 A1* | 3/2011 | Wan et al. | 250/423 R |
| 2011/0089334 A1* | 4/2011 | McRay | 250/398 |
| 2011/0140007 A1* | 6/2011 | Ogino et al. | 250/492.22 |
| 2011/0155929 A1* | 6/2011 | Bassom et al. | 250/492.21 |
| 2011/0233431 A1* | 9/2011 | Wan et al. | 250/492.21 |
| 2011/0278478 A1* | 11/2011 | Jen | 250/492.21 |

FOREIGN PATENT DOCUMENTS

| | | |
|---|---|---|
| JP | 11-339711 | 12/1997 |
| JP | 2001-229872 A | 8/2001 |
| JP | 2007172927 | 7/2007 |
| JP | 2007200896 | 8/2007 |
| KR | 10-2008-0106956 A | 12/2008 |

* cited by examiner

IMPLANT METHOD AND IMPLANTER BY USING A VARIABLE APERTURE

FIELD OF THE INVENTION

The invention generally relates to an implant method and an implanter for implanting substrate, and more particularly relates to a method and an implanter capable of implanting different portions of one or more substrate by using different customized ion beams shaped respectively by a variable aperture located right in front of the one or more substrate.

DESCRIPTION OF THE RELATED ART

In general, as shown in FIG. 1A, an implanter has at least an ion source 101 and an analysis magnet 102. An ion beam 103 is generated by the ion source 101 and then analyzed by the analysis magnet 102 to screen out the ions with un-desired charge-mass ratio(s). After that, the ion beam 103 is implanted into a substrate 104 (such as a wafer or a panel). As usual, the quality of the ion beam 103 outputted from the analysis magnet 102 is not good enough for efficiently implanting the substrate 104. For example, the ion beam current distribution on the cross section of the ion beam 103 may be undulant or have a long tail. Then, the implantation of the ion beam 103 on the substrate 104 may be non-uniform if no extra step/device is used to improve the distribution of implanted ions (or atoms and/or molecules) in the substrate 104. For example, it is common that in certain beam current and/or energy range for a given species of ion beam 103, the beam shape, size or cross section falls short from the spec requirements. Then, the dose distribution control for one or more dose regions on the substrate 104 can not be optimized. For example, for dose split or other non-uniform implantation, different portions of the substrate 104 require different doses. Then, even the qualify of a fixed ion beam 103 is well qualified for one dose region, different portions still have to be implanted differently for providing different doses by using the fixed ion beam 103. Note that this is true for both types of beams typically used, the spot ion beam and the ribbon ion beam.

One prior art, as shown in FIG. 1B, improves these disadvantages by using the magnet assembly 105 to further enhance the beam optics for modifying (deforming, collimating and/or deflecting) the beam 103 in a position between the analysis magnet 102 and the substrate 104. As usual, the magnet assembly 105 has one or more magnet, where each magnet may provide a uniform or non-uniform magnetic field. However, the details of the magnet assembly 105 are not limited. Herein, as an example, the magnet assembly 105 is located around the trajectory of the ion beam 103, such that the motion of each ion of the ion beam 103 is directly modified by the magnetic field generated by the magnet assembly 105. Hence, by properly adjusting the operation of the magnet assembly 105, such as adjusting the current applied to the magnets or adjusting the relative geometric relations among different magnets, the ion beam 103 is correspondingly modified and then the projected area of the ion beam 103 on the substrate 104 can be correspondingly adjusted. However, the cost of the magnet assembly 105 is high, the precise adjustment of the magnetic filed is difficult, and the process of modifying ion beam by the magnetic filed is complex and time consuming.

Another prior art, not shown in any figure, improves these disadvantages by adjusting the operation of the ion source 101 and/or the analysis magnet 102, such that the ion beam 103 outputted from the analysis magnet 102 may be modified as well. However, the cost is high and the operation is complex, and the room for adjustment of the ion beam 103 is limited. The other prior art, not shown in any figure, improves these disadvantages by adjusting the scan parameter(s), such as scan path pitch and the scan speed, such that different implantation are differently achieved by the same ion beam 103. Similar, the cost and the operation still is high and complex, and the room for adjustment of the scan parameter(s) is limited.

Still one prior art, as shown in FIG. 1C, improves these disadvantages by using an aperture device 106 with a fixed aperture 107 to shape the ion beam 103 before the substrate 104 in implanted by the shaped ion beam 103. Reasonably, by properly choosing the fixed aperture 107, the ion beam 103 can be shaped without modifying the ion beam 103 itself. In other words, the prior art does not need to further modify the ion beam 103 outputted from the analysis magnet 102 by any magnetic/electric filed and also does not need to adjust the operation of the ion source 101 and/or the analysis magnet 102. In addition, the fixed aperture only can shape the ion beam 103 but can not adjust the ion beam 103, such as adjusting the ion beam current distribution on the cross section of the ion beam 103. Hence, another prior art as shown in FIG. 1D positions the fixed aperture 107 within the aperture device 106 at an end of a beam optics and right in front of the substrate 104. Hence, after the ion beam 103 is modified by the beam optics, the ion beam 103 can be further shaped by the fixed aperture 107 again to achieve better shape of projected area of the ion beam 103 on the substrate 102. In other words, by using the fixed aperture 107, the required adjustment of the ion beam 103 provided by the beam optics can be less strict than the required adjustment of the ion beam provided by the beam optics without using any aperture. However, the two prior arts have a major disadvantage: lack of flexibility. The shape and the size of a fixed aperture 107 is fixed, and then the room for adjusting of the shaped ion beam 103 is finite even the overlap between the ion beam 103 and the fixed aperture 107 is changed by shifting the aperture device 106 aperture device along a direction vertical to the ion beam 103 and/or rotating the aperture device 106 around another direction in three-dimensional space at intersecting of the ion beam 103 through a tilt or twist mechanism. Hence, multiple aperture devices 106 with different fixed apertures 107 are required and then the implantation on one or more substrate 104 may be interrupted several times for substituting the multiple aperture devices 106 to use different fixed apertures 107 for achieving different implantations.

Accordingly, it is still desirable to develop different approach to improve the above disadvantages, especially to develop a simple and cheap approach.

SUMMARY OF THE INVENTION

The present invention is directed to an implant method and an implanter capable of shaping an ion beam before a substrate is implanted by the shaped ion beam. Herein, an aperture device with a variable aperture is used to shape the ion beam, such that the shape and/or the size of the ion beam is confined and modified by the variable aperture. Therefore, different shaped ion beams can be differently provided by simply adjusting the variable aperture, even further by shifting, tilting and/or twisting the variable aperture. In other words, the flexibility of the proposed variable aperture is significantly high.

Some potential applications of the proposed variable aperture are related to the optimization of the implantation of a substrate. Herein, the variable aperture is flexibly adjusted so let both the size and the shape of the projected area of an shaped ion beam on the substrate(s), even the quality of the shaped ion beam, is optimized. For example, the variable aperture can be flexibly adjusted to implant different dose regions with different shaped ion beams without re-tuning the ion beam or replacing the hardware used to adjust the ion beam. Another potential application of the present invention is to flexibly adjust the variable aperture according to an ion beam current distribution on the cross section of the ion beam, such that only a desired portion of the ion beam is implanted into the substrate. Herein, the desired portion may be a constant-value-like central portion or a Gaussian-distribution-like central portion. For example, when the ion beam has a long tail, i.e. long tail on its cross section, it is optional to flexibly adjust the variable aperture to properly cut off the long tail such that the control of the implantation on substrate is not affected by the long tail. The other potential application of the proposed variable aperture is to flexibly adjust the variable aperture to shape the ion beam for implanting each dose region on the substrate according to at least one of the following: a required dose of the dose region, a shape of the dose region, and a size of said dose region. Reasonably, the potential application is more suitable for the dose split, because different shaped ion beams required to implant different dose regions may be efficiently acquired by only adjusting the variable aperture. Still a further potential application of the present invention is to accelerate the beam tune process for providing different ion beams to achieve different implantations on one or more substrate. Initially, the ion beam generated by the ion source is modified by a beam optics (such as the analysis magnet and the magnet assembly), such that at least a specific portion of the cross section of the ion beam has good enough quality. Then, by flexibly adjusting the variable aperture, the specific portion of the ion beam may be separately shaped to form the required different ion beams without amending the ion beam itself.

One embodiment of the present invention is an implant method for implanting a substrate. Initially, provide an ion beam and a substrate. Then, adjust a variable aperture within an aperture device, such that the substrate is implanted by a shaped ion beam shaped by the variable aperture. Herein, one or more of size and shape of the variable aperture is adjustable. To enhance the efficiency, the variable aperture within the aperture device is positioned at end of a beam optics and right in front the substrate. Hence, after the current distribution on the cross section of the ion beam is tuned well by the beam optics, the ion beam may be shaped simply by only adjusting the variable aperture without further adjustment on the beam optics. Optionally, the variable aperture is adjusted after the substrate is implanted and before a different substrate is implanted, such that different substrates are implanted by different shaped ion beams. Optionally, the variable aperture is adjusted at least twice during an implantation on a substrate, such that different portions of the substrate are implanted by different shaped ion beams.

Another embodiment of the present invention is an implant method for implanting a substrate. Initially, provide an ion beam and a substrate. Then, shape the ion beam by a variable aperture within an aperture device before the substrate is implanted by the shaped ion beam, wherein one or more of size and shape of the variable aperture can be flexibly adjustable. Herein, to enhance the efficiency, the variable aperture within the aperture device is positioned at an end of a beam optics and right in front of the substrate. Hence, after the current distribution on the cross section of the ion beam is tuned well by the beam optics, the ion beam may be shaped simply by only adjusting the variable aperture without further adjustment on the beam optics. Optionally, the variable aperture is adjusted after the substrate is implanted and before a different substrate is implanted, such that the different substrates are implanted by different shaped ion beams. Optionally, the variable aperture is adjusted at least twice during an implantation on a substrate, such that different portions of the substrate are implanted by different shaped ion beams.

Note that the invention does not limit the mechanical design of the aperture device with the variable aperture. For example, it can be some movable plates that each has an opening, or a combination of a fixed plate having an opening and a movable plate without any opening.

DETAILED DESCRIPTION OF THE INVENTION

Reference will now be made in details to specific embodiments of the present invention. Examples of these embodiments are illustrated in the accompanying drawings. While the invention will be described in conjunction with these specific embodiments, it will be understood that the intent is not to limit the invention to these embodiments. In fact, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without at least one of these specific details. In other instances, the well-known process operation is not described in detail in order not to obscure the present invention.

Figure 1A:
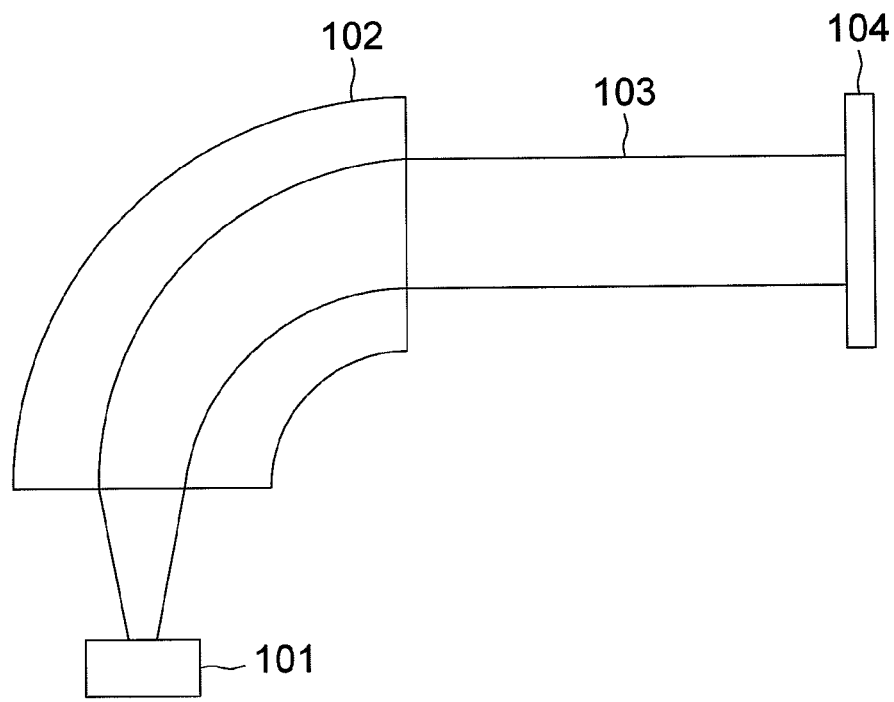
FIG. 1A to FIG. 1D respectively schematically illustrates the essential mechanism of some conventional implanters.
Figure 1B:
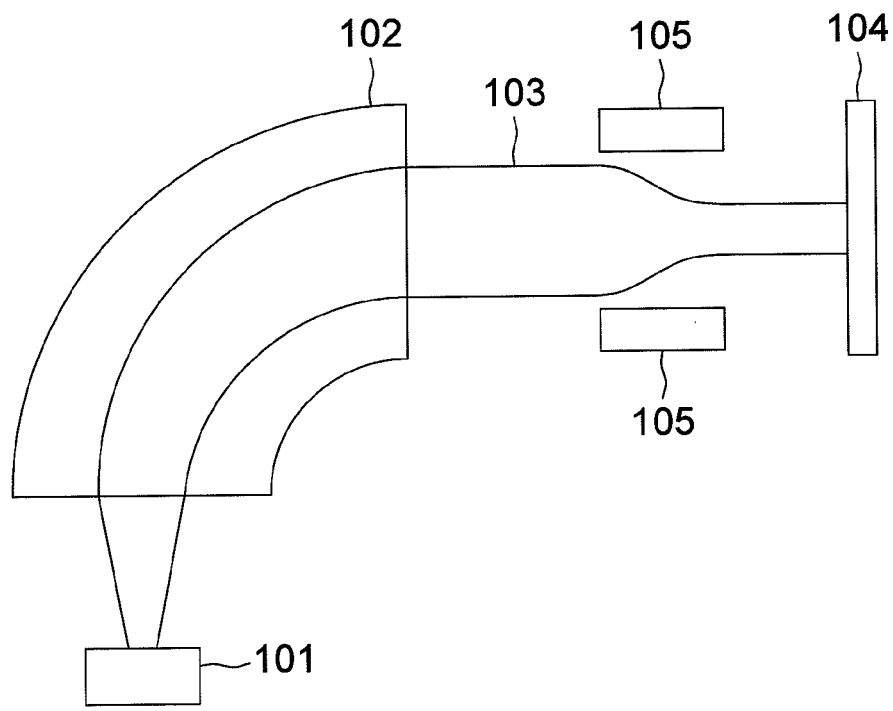
Figure 1C:
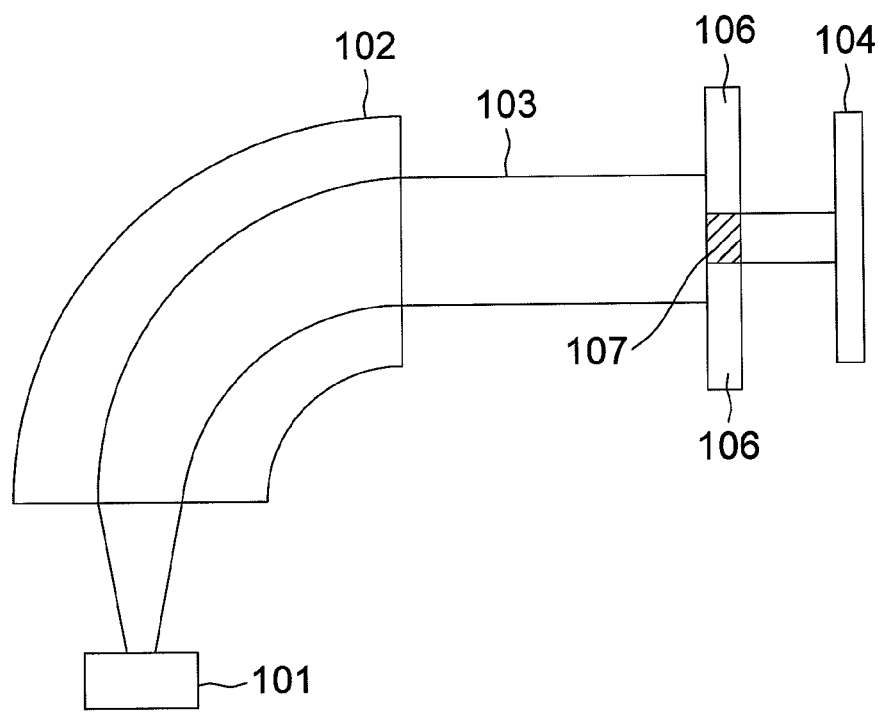
Figure 2A:
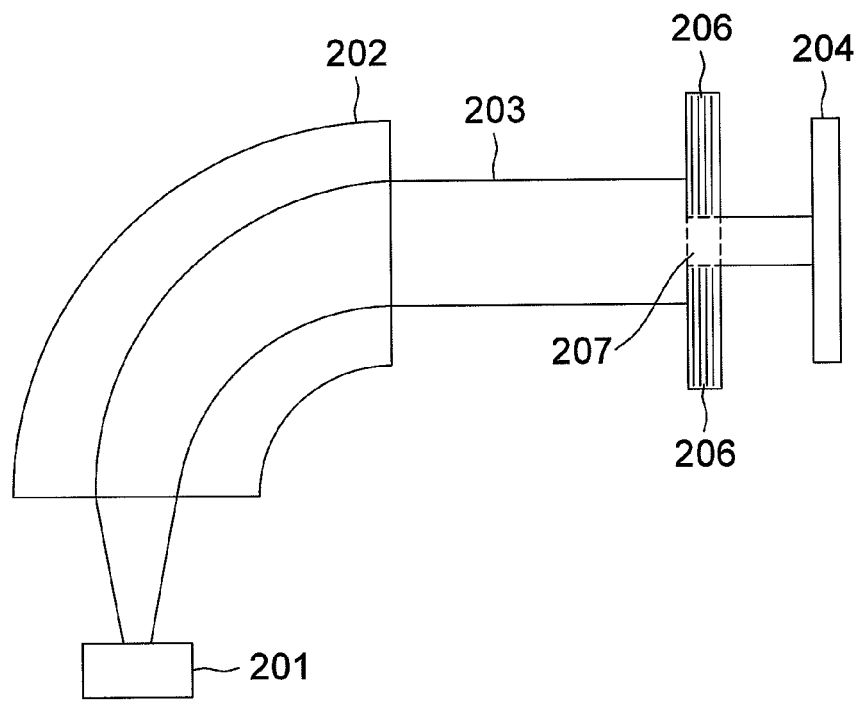
FIG. 2A to FIG. 2B schematically illustrates the essential mechanism of an implanter according to two embodiments of the present invention
Figure 2B:
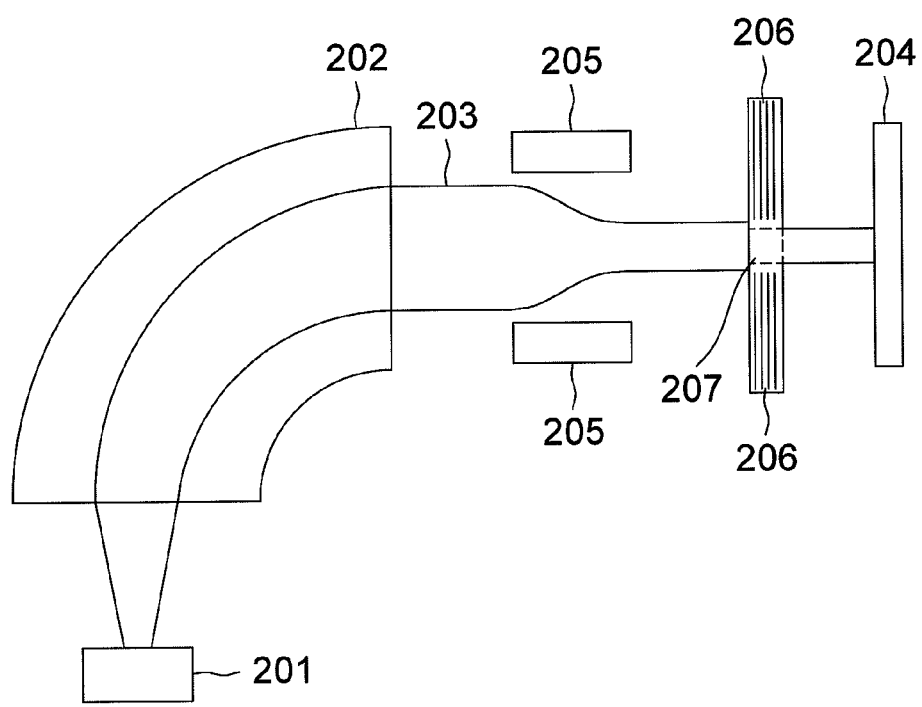

FIG. 2A schematically illustrates the essential mechanism of an implanter in accordance with one embodiment of this invention. Herein, the ion source 201 generates the ion beam 203 and the analysis magnet 202 screens out the ions with un-desired charge-to-mass ratios from the ion beam 203. Both the ion source 201 and the analysis magnet 202 may be viewed as an ion beam generation assembly. Before the substrate 204 is implanted, the ion beam 203 is shaped by the variable aperture 207 within the aperture device 206, such that one or more of shape and size of the ion beam 203 implanted into the substrate 204 (such as wafer and panel) can be different than that of the ion beam 203 just outputted from the analysis magnet 202. By comparing FIG. 2A with FIG. 1C, one main characteristic of the embodiment is the variable aperture 207. In the prior art, both the shape and the size of the fixed aperture 107 are fixed, and then the cross section of the shaped ion beam 103 also has a fixed shape and size. In contrast, in the embodiment, both the shape and the size of the variable aperture 207 may be variable among a range. Hence, both the shape and the size of the cross section of the shaped ion beam 203 also may be variable among the range. Herein, both the shape and the size of the variable aperture 207 are not particularly limited. For example, the shape of the variable aperture 107 can be oval, ellipse, circle or other contour capable of ensuring smooth ion beam current distribution of the shaped ion beam. Moreover, to enhance the efficiency of acquiring required ion beam, as the embodiment shown in FIG. 2B, the variable aperture 207 within the aperture device 206 is located right in front of the substrate 204 and at and end of the beam optics (such as the combination of the analysis magnet 202 and the magnet assembly 205). Herein, the details of the beam optics 205 are omitted because it may be any well-known beam optics. Furthermore, the aperture device 206 can be shifted along a direction vertical to the ion beam 103 and/or rotated around another direction in three-dimensional space at intersecting of the ion beam 103 through a tilt and/or twist mechanism, such that the overlap between the ion beam 103 and the variable aperture 207 may be further changed and then the room for adjustment of the shaped ion beam is increased. Note that the shift/tilt/twist mechanism of the aperture device 206 can be equal to the shift/tilt/twist mechanism of the aperture device 106, and then the related details are not discussed hereinafter.

Figure 1D:
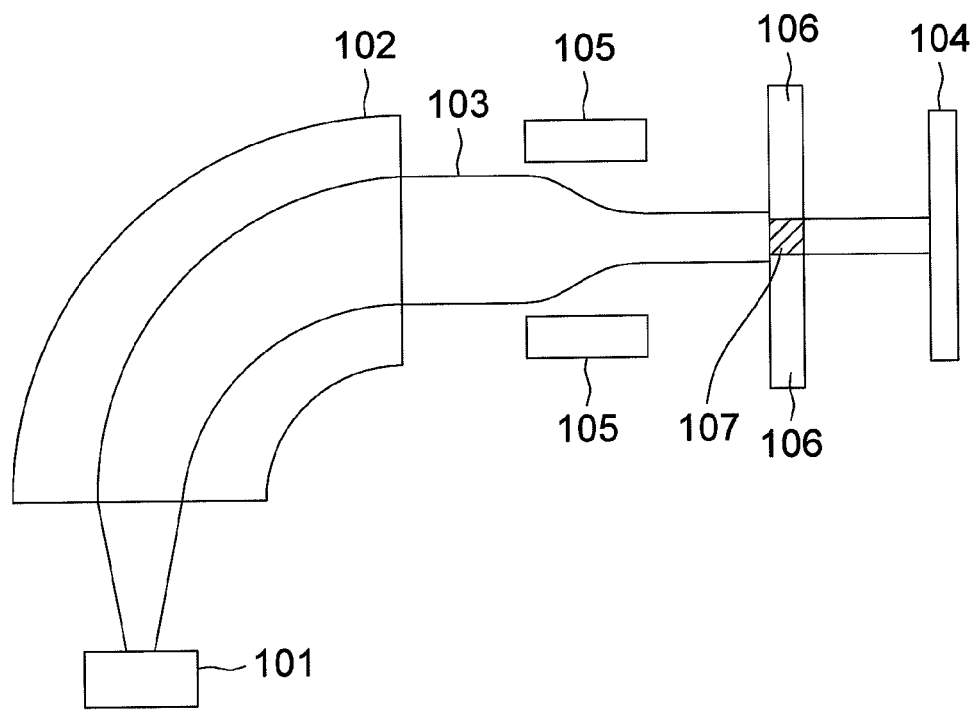
Figure 2C:
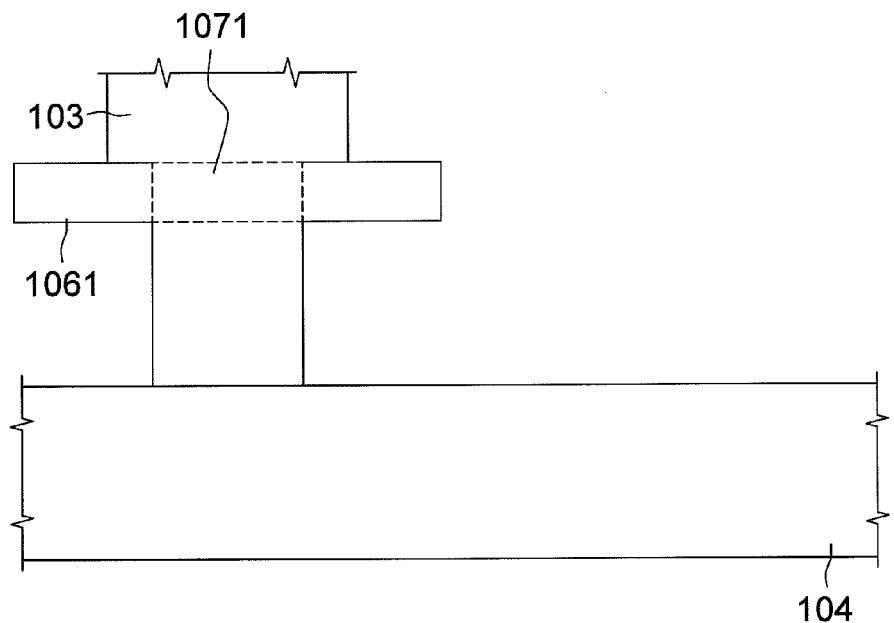
FIG. 2C to FIG. 2E illustrate how different shaped ion beams are generated and a corresponding flowchart according to the usage of the conventional fixed aperture.
Figure 2D:
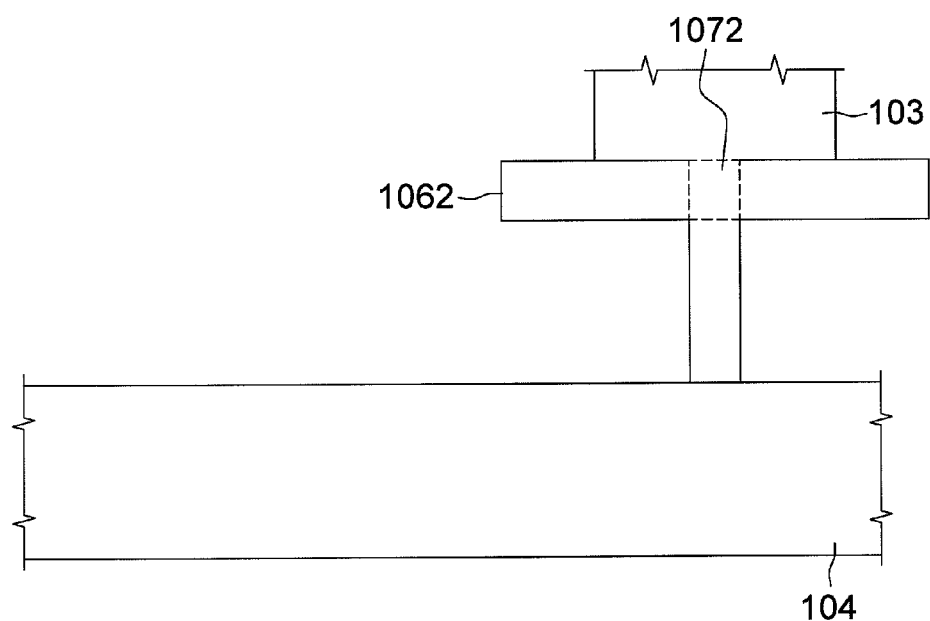
Figure 2E:
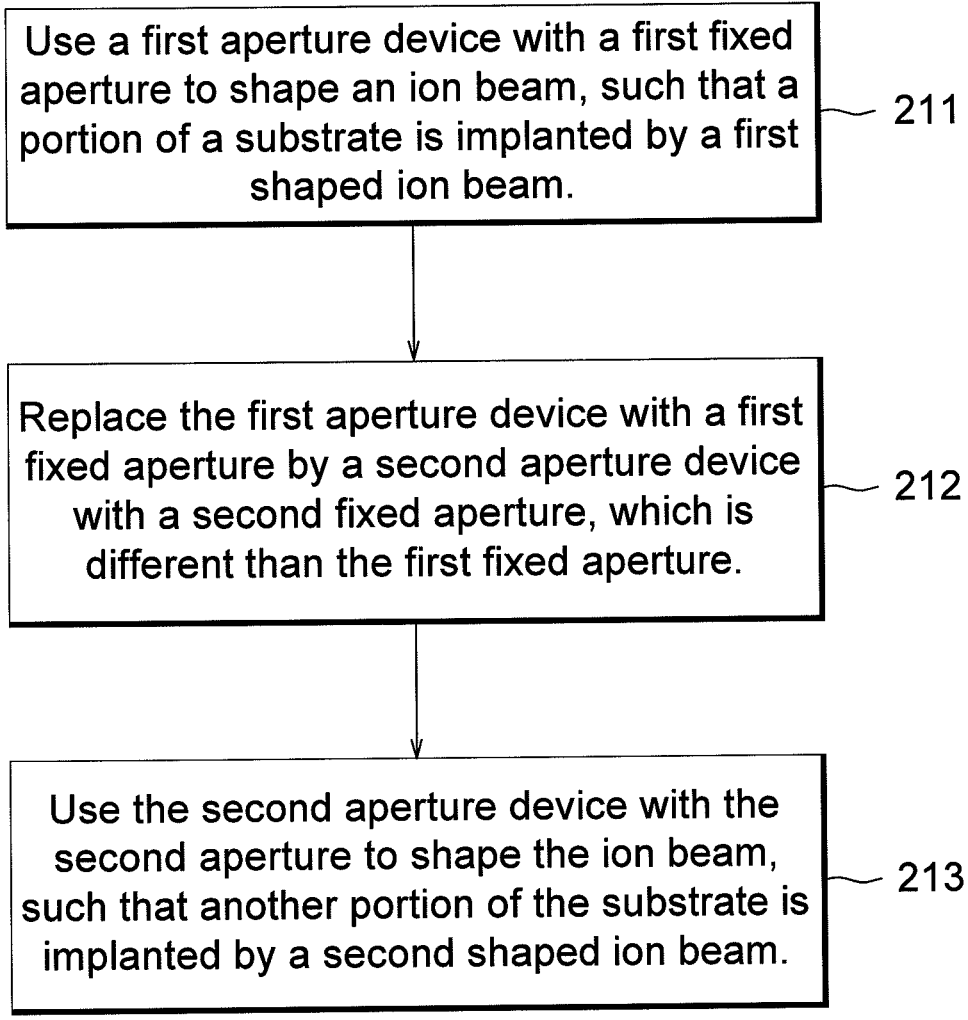
Figure 2F:
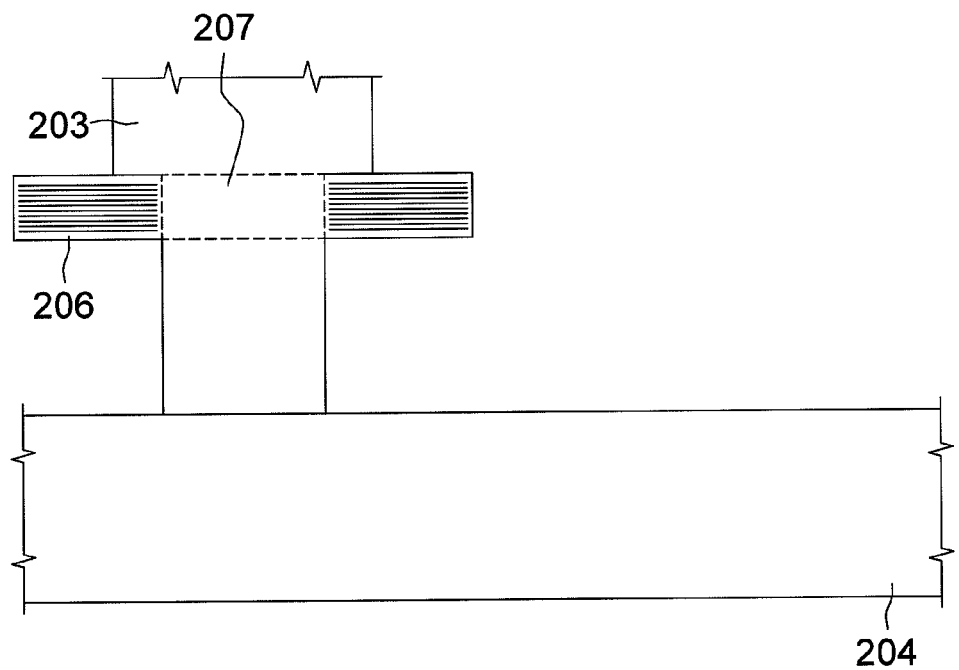
FIG. 2F to FIG. 2H illustrate how different shaped ion beams are generated and a corresponding flowchart according to one embodiment of the present invention.
Figure 2G:
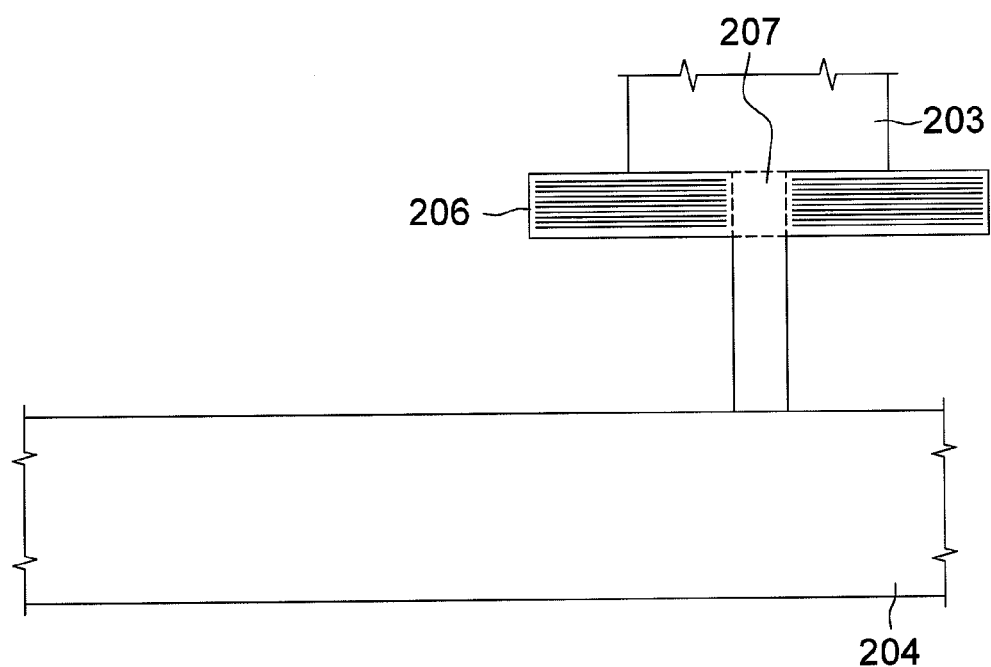
Figure 2H:
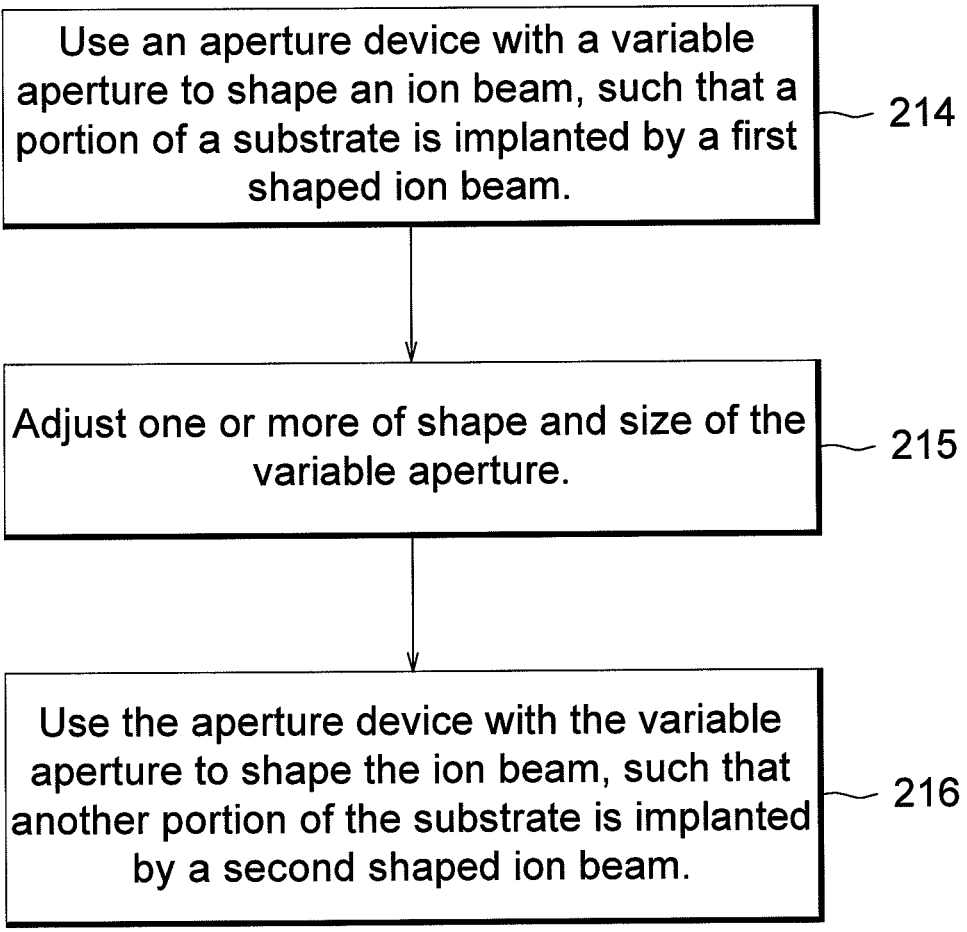

FIG. 2C to FIG. 2E shows how to use the conventional fixed aperture as shown in FIG. 1C and FIG. 1D to implant different dose regions with different shaped ion beams, and FIG. 2F to FIG. 2H shows how to use the proposed variable aperture to implant different dose regions with different shaped ion beams. As shown in FIG. 2C and FIG. 2D, different aperture devices 1061/1062 with different fixed apertures 1071/1072 are separately used to shape the same ion beam 103 for forming different shaped ion beams to separately implant different dose regions, such as different portions of the substrate 104. The corresponding method is shown in FIG. 2E. Herein, a key step is the block 212 that replace a first aperture device with a first fixed aperture by a second aperture device with a second fixed aperture, which is different than the first fixed aperture. In contrast, as the embodiment shown in FIG. 2F and FIG. 2G, one and only one aperture device 206 with a variable aperture 207 is used to shape the same ion beam 103 for forming different shaped ion beams to separately implant different dose regions, such as different portions of the substrate 204. The corresponding method is shown in FIG. 2H. Herein, a key step is the block 215 where the aperture device 206 is adjusted such that one or more of size and shape of the variable aperture 207 is adjusted. Of course, the key is how to provide different shaped ion beams for implanting different dose regions but not how the dose regions are distributed. In other words, the embodiment shown in FIG. 2E to FIG. 2H can be expanded to cover the case that different substrates 204 have different required doses but each substrate 204 has one and only one dose region.

The proposed variable aperture also may be used to accelerate the beam tune process. For example, different but similar shaped ion beams may be required to implant different lots of substrates, such that different substrates may have different uniform doses. In such situation, after an original ion beam is acquired by properly adjusting the beam optics, the different shaped ion beams may be separately acquired by repeatedly adjusting the variable aperture. Initially, the variable aperture is set to have a first shape and a first size so let a first shaped ion beam may be generated by using the variable aperture to shape the original ion beam. Then, after some substrates having a first dose are all implanted, the variable aperture is adjusted to have a second shape and a second size so let a second shaped ion beam may be generated by the adjusted variable aperture to shape the same original ion beam. By repeating the above steps, different substrates having different doses may be implanted by only adjusting the variable aperture to separately shape the original ion beam. In other words, the beam optics, even the ion source, needs not be repeatedly adjusted to provide different ion beams for implanting different substrates with different doses. Also, need not to exchange the aperture device with the variable aperture during a period of implanting different substrates with different doses. Accordingly, the beam tune process is accelerated and faster than other beam tune process using the above prior arts.

Figure 3A:
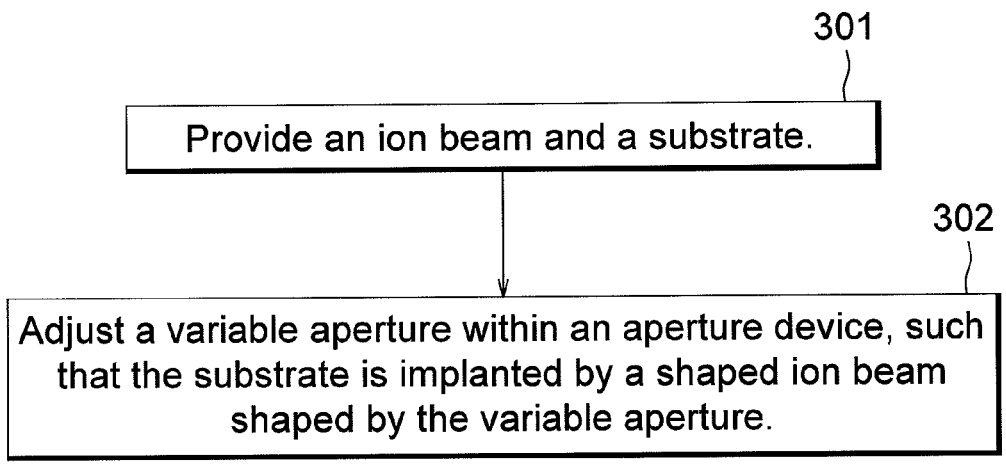
FIG. 3A to FIG. 3B respectively illustrates an implant method according to two embodiment of the present invention.
Figure 3B:
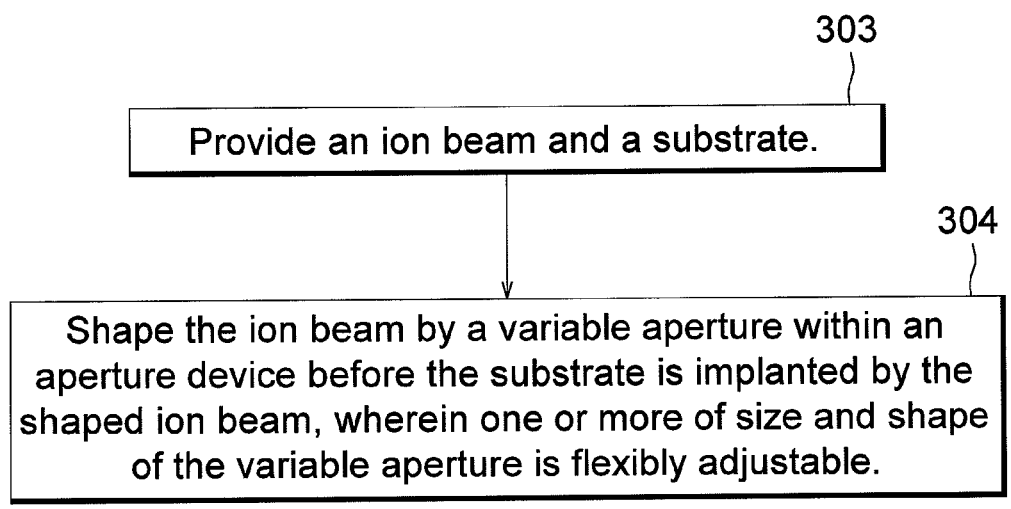

Reasonably, to achieve the same room of adjustment on the shaped ion beam, an aperture device 206 with a variable aperture 207 can replace some aperture devices 106 that each has an individual fixed aperture 107, and then both the total hardware cost is reduced and the flexibility of adjusting the shaped ion beam is increased. Also, the step of replacing multiple aperture devices 106 with different fixed apertures 107 is replaced by the step of adjusting a variable aperture 206 with an aperture device 207, and then the time consumption used to provide different shaped ion beam is reduced. Moreover, as usual, these different aperture devices 106 are stored outside the implanter chamber for reducing the chamber size, and then both the vacuum venting process and the vacuum pumping process are desired for replacing different aperture devices 106. In contrast, the adjustment of an aperture device 206 located inside the implanter chamber can be achieved without any vacuum venting process or any vacuum pumping process. Hence, the operation is simplified and the risk of contamination is reduced Other embodiments include two methods for implanting a substrate, as shown in FIG. 3A and FIG. 3B. In the former embodiment, as shown in block 301, provide an ion beam and a substrate; and as shown in block 302, adjust a variable aperture within an aperture device, such that the substrate is implanted by a shaped ion beam shaped by the variable aperture. One main character of this embodiment is the step of adjusting the variable aperture. In the latter embodiment, as shown in block 303, provide an ion beam and a substrate; and as shown in block 304, shape the ion beam by a variable aperture within an aperture device before the substrate is implanted by the shaped ion beam, wherein one or more of size and shape of the variable aperture is flexibly adjustable. One main character of the embodiment is the limitation "one or more of size and shape of the variable aperture is flexibly adjustable". Moreover, for both embodiments, the variable aperture can be adjusted again after the substrate has been completed implanted and before another substrate is implanted. Hence, different substrates can be implanted by different shaped ion beams in sequence. Similarly, for both embodiments, the variable aperture can be adjusted at least twice during the implantation of the substrate. Hence, different portions of the substrate can be implanted by different shaped ion beams.

Figure 4A:
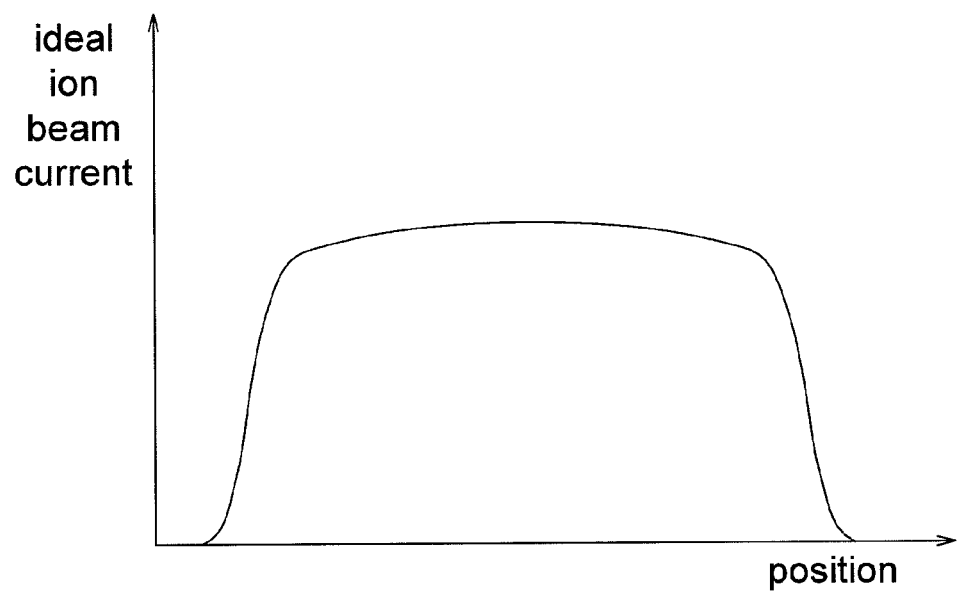
FIG. 4A to FIG. 4C illustrate schematic views for showing how the practical ion beam current distribution of an ion beam to be implanted into a substrate is amended according to one embodiment of the present invention.
Figure 4B:
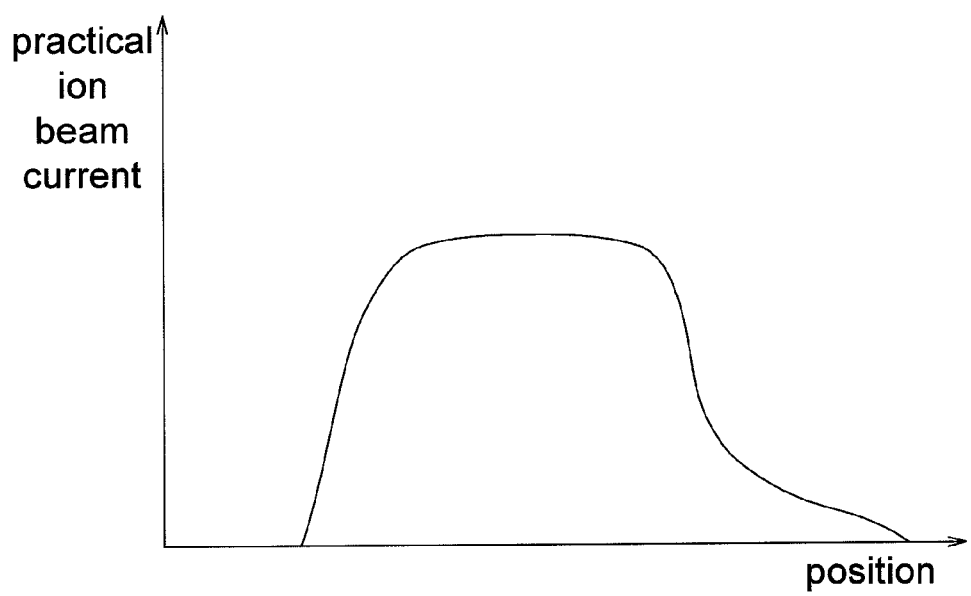
Figure 4C:
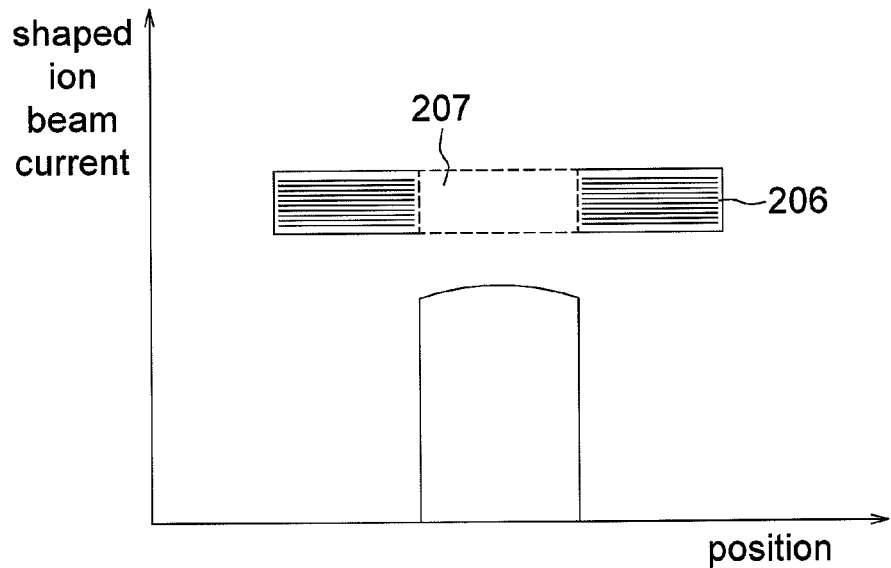

One more embodiment is a potential application of the proposed variable aperture. As shown in FIG. 4A, an ideal ion beam current distribution on a cross section of the ion beam may be a symmetric curve which has a smooth and non-undulant portion and a short tail locating on the edge of the smooth and non-undulant portion Herein, the term "smooth and non-undulant portion" is more generally referring to a beam profile leading to more uniform dose distribution after one or more scans on the substrate, when the scan parameter may be adjusted accordingly. However, in the practical world, as shown in FIG. 4B, the real ion beam current distribution on the cross section of the ion beam may be asymmetrical and/or or may have a long tail. The differences between the practical distribution and the ideal distribution usually are proportional to the size of the ion beam, and usually are distributed on the edge of the ion beam current distribution. The difference between the practical distribution and the ideal distribution also may be time dependent and may be different for different required ion beam currents and ion beam voltages. Therefore, as shown in FIG. 4C, by using the proposed aperture device 206 with variable aperture 207, the ion beam can be flexibly and efficiently shaped so that the quality of shaped ion beam almost is not affected by the differences between the ideal ion beam current distribution and the practical ion beam current distribution. For example, after the practical ion beam current distribution is detected by a beam profiler, the variable aperture may be flexibly adjusted to have a specific size and a specific shape corresponding to a required smooth and non-undulant portion of the practical ion beam current distribution. The, by using the adjusted variable aperture to shape the ion beam, essentially only the required portion of the practical ion beam will be used to implant the substrate. Note that FIG. 4C only is an idea figure where both the size and the shape of the shaped ion beam are perfectly equal to that of the adjusted variable aperture 207. Indeed, owing to at least the space charge effect, the size and the shape of the projected area of the shaped ion beam on the substrate should be different than the size and shape of the adjusted variable aperture 207. However, owing to the variable aperture 207 usually is positioned very close to the substrate, the effect of the variable aperture 207 essentially is not degraded by it.

Figure 5:
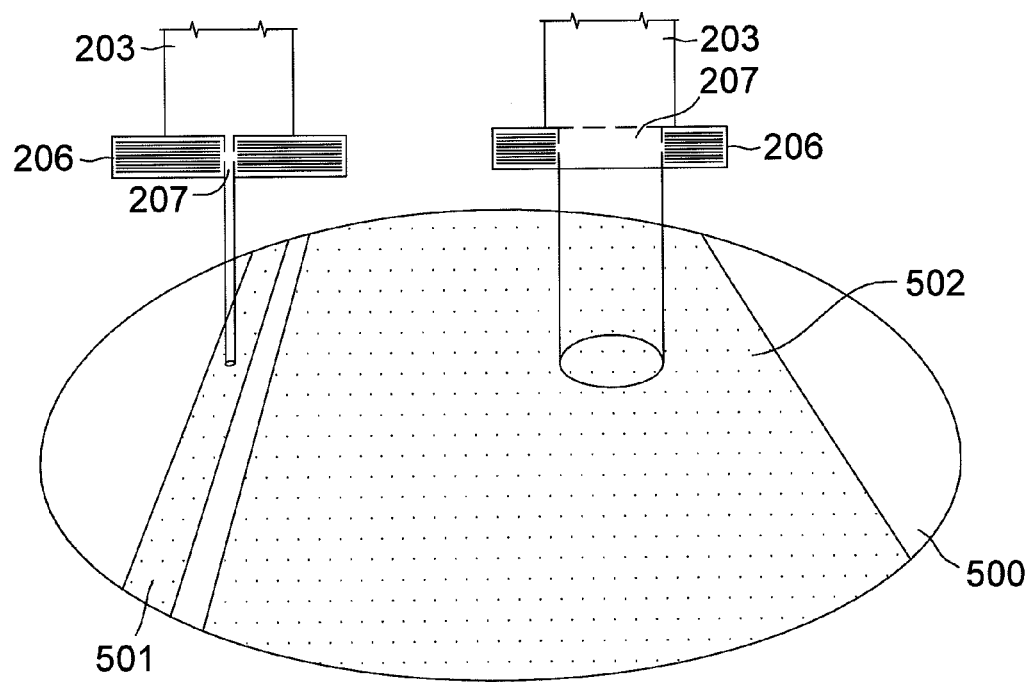
FIG. 5 illustrates a schematic view for showing how the dose split situation is properly achieved according to one embodiment of the present invention.

Another embodiment also is a potential application of this proposed variable aperture. The potential application is related to the "dose split", especially is related to the situation that different dose regions on same substrate requires different doses. As shown in FIG. 5, two dose regions 501/502 with different sizes/shapes are separately located on the substrate 500. Then, by using the aperture device 206 with the variable aperture 207, two shaped ion beams are respectively used to implant the two dose regions 501/502. For the situation that the two dose regions 501/502 require different doses, the two shaped ion beams will have different sizes (different lengths and/or different widths). Clearly, the projected areas of the different shaped ion beams on the substrate 500 will have different size, and then the implanted area of the different shaped ion beams will be different even the different shaped ion beams are moved along same scan path with same scan speed. The wider the shaped ion beam is, the larger the implanted area is. Therefore, even the scan parameters' values (such as the scan path and the scan speed) are uniformly distributed over the substrate 500 (at least uniformly distributed over the dose regions 501/502), the two dose regions 501/502 will have different doses after both the dose regions 501/502 are thoroughly scanned by the different shaped ion beams respectively.

Still another embodiment also is a potential application of the proposed variable aperture. In FIG. 5, the shape of each of dose regions 501/502 is simple and regular. However, sometimes, the dose regions may have irregular shapes. For example, a former deposition process may be imperfectly proceeded and then a deposited film with non-uniform thickness is formed on a substrate. Note that the etching rate of the deposited film may be changed if the quality of the deposited film is changed by implanted atoms/molecules/ions. Hence, a non-uniform implanting process may be performed to non-uniformly change the quality of the deposited film before a latter uniform etching process is performed. Herein, the higher the thickness of a portion of the deposited layer is, the lower the implant dose in this portion of the deposited layer is. Therefore, one advantage of this embodiment is significant. The shape/size of the variable aperture can be continuously adjusted during a period of scanning an ion beam through a substrate, such that the shaped ion beam can be continuously adjusted to fit the shape of different dose regions corresponding different portions of the non-uniform deposited film.

Figure 6A:
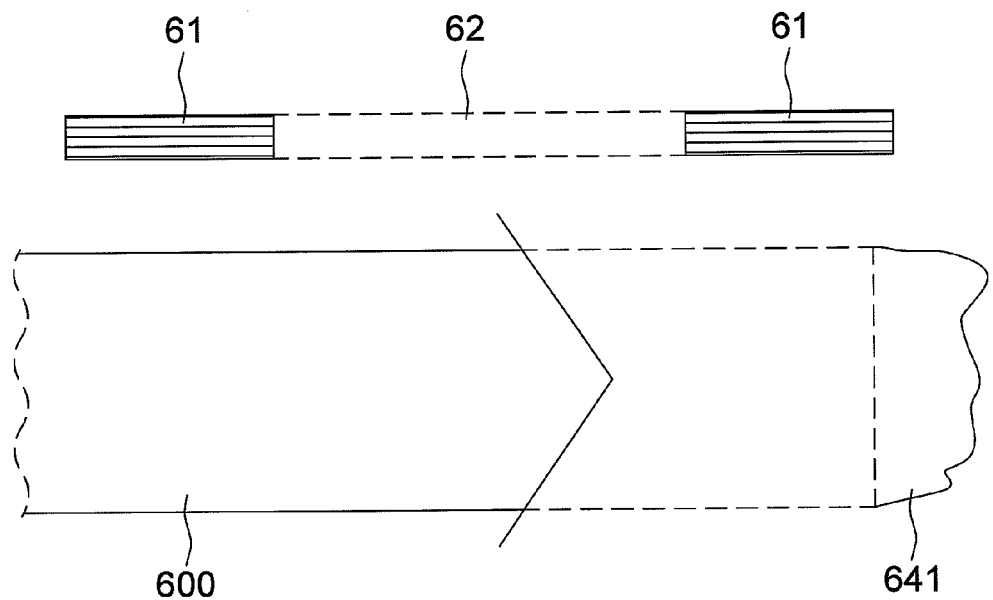
FIG. 6A to FIG. 6D illustrates a schematic view for showing how the beam tune process is accelerated according to one embodiment of the present invention.
Figure 6B:
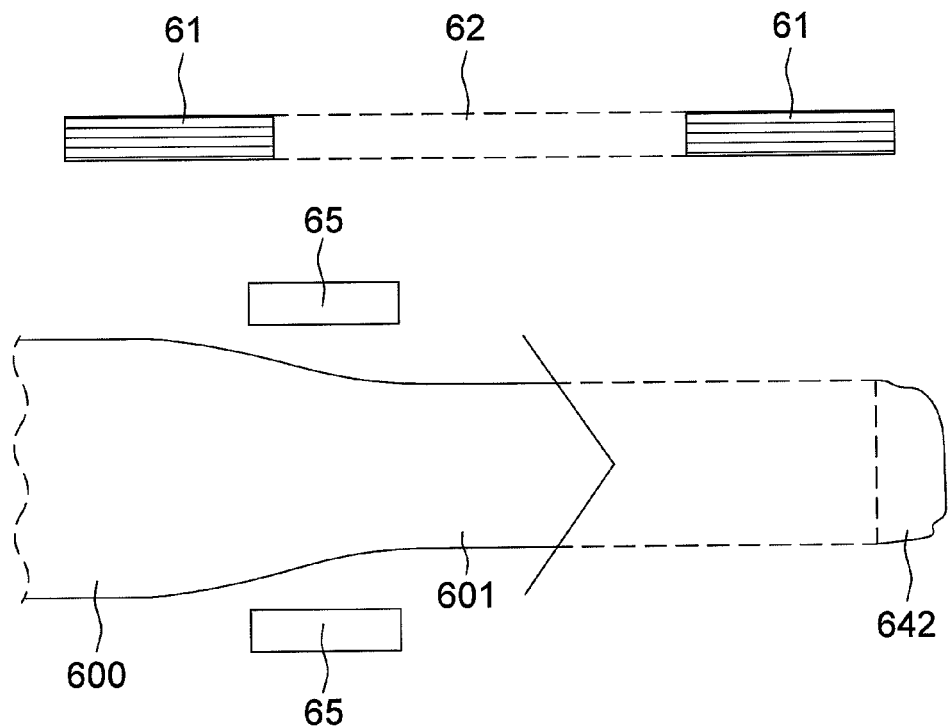
Figure 6C:
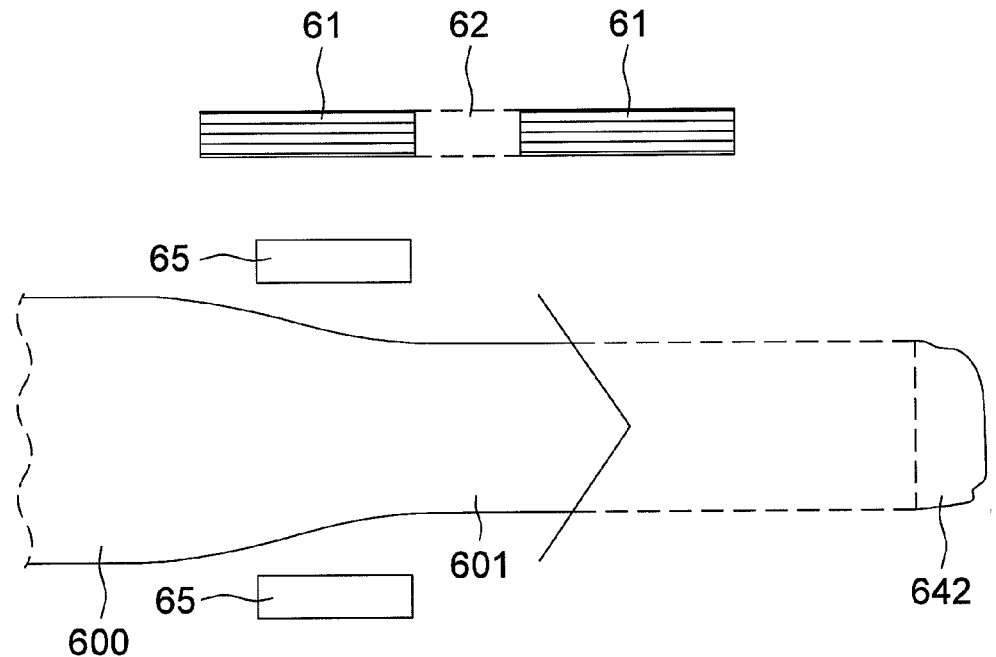
Figure 6D:
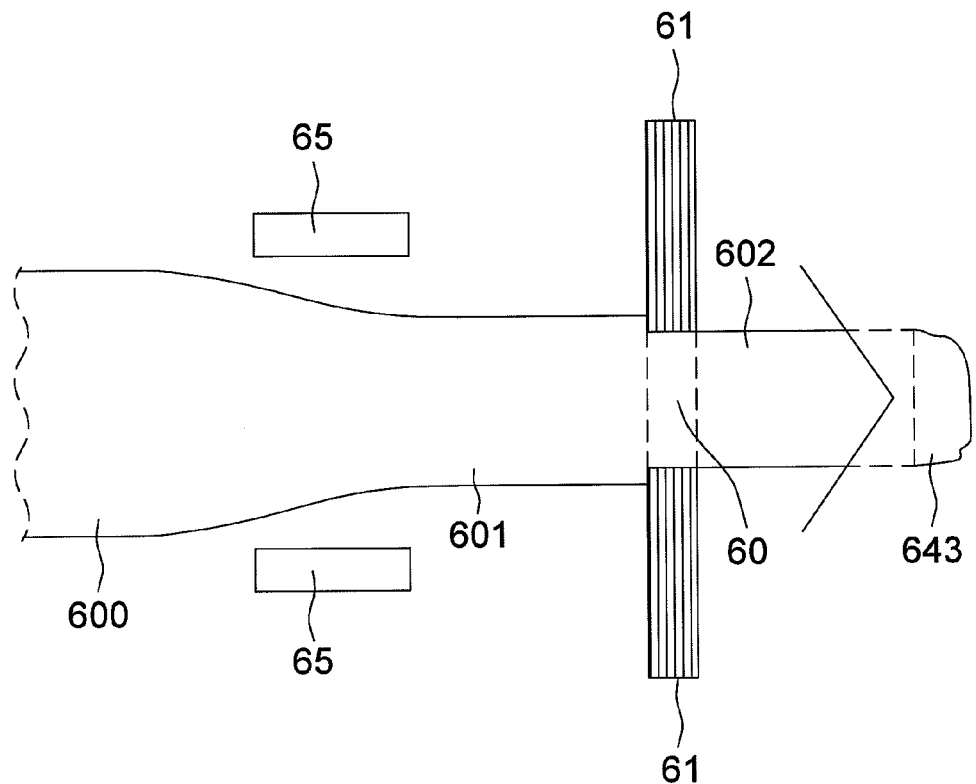

Further, another embodiment is related to how to accelerate the beam tune process by the proposed variable aperture as shown in FIG. 6A to FIG. 6D. Initially, as shown in FIG. 6A, an original ion beam 600 and a variable aperture 61 within an aperture device 62 are provided. Herein, the original ion beam 600 is outputted from an analysis magnet and has original ion beam current distribution 641 on the cross section of the original ion beam 600, which may be measured by using a beam profiler. Then, as shown in FIG. 6B, the original ion beam 600 is further modified by using a manage assembly 65 which is a portion of a beam optics, even by changing the operation of an ion source. Hence, an amended ion beam current distribution 642 on the cross section of the modified ion beam 601 is acquired. Herein, the amended ion beam current distribution 642 is smoother and less undulant than the original ion beam current distribution 641, and essentially has a desired central portion and a surrounding tail. Herein, the desired portion may be a constant-value-like central portion or a Gaussian-distribution-like central portion. As usual, one or more of the shape and the size of the modified ion beam 601 is different that of the original ion beam 600. Next, as shown in FIG. 6C, the aperture device 62 is adjusted so that the variable aperture 61 is smaller than or equal to the desired central portion. Finally, as shown in FIG. 6D, the modified ion beam 601 is shaped by the adjusted variable aperture 61 within the aperture device 62, so as to let a shaped ion beam 602 with good ion beam current distribution 643 on its cross section be implanted into a substrate. Accordingly, by using the proposed variable aperture 61, the beam tune process may be simplified into two steps. In the first step, the ion beam 60 is briefly modified by the beam optics to have at least a desired portion. In the second step, the variable aperture 61 is flexibly adjusted to only allow the desired central portion become a shaped ion beam 602 to be finally implanted into the substrate 66. Reasonably, when beam optics are used to only briefly modify the original ion beam 600 but not directly acquire the final shaped ion beam 602, the modification of the beam optics is significantly simplified. Not only may time consumption of the adjustment of the beam optics be reduced, but also the required adjustment preciseness of the beam optics may be simplified. Besides, to compare the prior art of using the fixed aperture, a variable aperture 61 can support a large room for adjustment of the ion beam 103. Thus, not only the cost of multiple fixed apertures may be saved, but also the time consumption and potential contamination during the step of replacing different fixed aperture may be reduced. Thus, the beam tune process is significantly accelerated by the usage of the variable aperture.

In addition, the proposed variable aperture can be used to flexibly shape the ion beam, no matter whether it is spot ion beam or a ribbon ion beam. The aperture device will block partial ion beam and allow partial ion beam to pass through the variable aperture. Herein, to avoid potential contamination and overcome the high temperature issue raised by the collision between the ion beam and the aperture device, the material of the aperture device usually is graphite. Moreover, to further improve the quality of the implantation by using the present variable aperture, it is optional to adjust the variable aperture when the ion beam is not projected on the substrate, such that the substrate will be implanted by only properly adjusted shaped ion beam(s). In other words, during a period of adjusting the variable aperture, the ion beam and/or the substrate may be parked. For example, the substrate may be parked when the substrate is at position not seeing the ion beam, such as parking the substrate at a scan turn around point when the ion beam is tuning or the variable aperture is adjusted. For example, the ion beam may be parked by turning off the analysis magnet or suppressing landing of the ion beam where there is cooling, especially when a long duration is expected.

Note that both the magnetic field and/or the electric field are efficient to modify an ion beam, no matter to the change the shape of the ion beam to change the ion beam current distribution on the cross section of the ion beam. Hence, it is popular to use the beam optics to modify the ion beam firstly, and then to use the variable aperture within the aperture device in shape the modified ion beam in sequence. However, the potential applications of the proposed variable aperture may be independent on the usage of the beam optics, and also the characteristic of the proposed variable aperture is not limited by other portions of the beam optics.

Furthermore, the invention never limits the details of the mechanical design of the aperture device 206 and the variable aperture 207. For example, the aperture device 206 can have some movable plates where each has an opening. Hence, the overlap of these openings can form the variable aperture 207, and the relative movement among these movable plates can adjust one or more of size and shape of the overlap (i.e. one or more of size and shape of the variable aperture 207). For examples, the aperture device 206 may be some plates capable of moving relative to each other, a combination of a fixed plate and a movable plate where each plate has a hole, or a combination of four plates where two is movable along X-direction and another two is movable along Y-direction. Hence, the variable aperture can be adjusted by modifying a relative geometric relation among one or more plates used to define the variable aperture, or by moving one or more plates used to define said variable aperture.

Variations of the method and the implanter as described above may be realized by one skilled in the art. Although the method and the implanted have been described relative to specific embodiments thereof, the invention is not so limited. Many additional changes in the embodiments described and/or illustrated can be made by those skilled in the art. Accordingly, it will be understood that the present invention is not to be limited to the embodiments disclosed herein, can include practices other than specifically described, and is to be interpreted as broadly as allowed under the law.

What is claimed is:

1. A method of implanting ions onto a substrate using an ion beam and a variable aperture, the method comprising:
   obtaining a substrate, the substrate having non-uniform properties due to a previous deposition process;
   determining, by an ion implanting device, a first ion beam parameter for a first portion of the substrate and a different second ion beam parameter for a different second portion of the substrate in response to the non-uniform properties of the first portion and the properties of the second portion, respectively;
   producing the ion beam and directing the produced ion beam to the variable aperture;
   shaping the ion beam using the variable aperture to form a first shaped ion beam having the first ion beam parameter and applying the first shaped ion beam to the first portion of the substrate; and
   shaping the ion beam using the variable aperture to form a second ion beam having the second ion beam parameter and applying the second ion beam to the second portion of the substrate.

2. The method of claim 1,
   wherein the first shaped ion beam is different in size from the second shaped ion beam.

3. The method of claim 1,
   wherein the first portion of the substrate and the second portion of the substrate have different etching rates due to their corresponding properties, and
   wherein the first shaped ion beam is smaller in size than the second shaped ion beam.

4. The method of claim 1,
   wherein the first portion of the substrate and the second portion of the substrate have different etching rates due to their corresponding properties, and
   wherein the first shaped ion beam is larger in size than the second shaped ion beam.

5. The method of claim 4,
   wherein the first shaped ion beam is different in shape from the second shaped ion beam.

6. The method of claim 1,
   wherein the first shaped ion beam and the second shaped ion beam have the same shape,
   wherein the first shaped ion beam is applied to the first portion for a time duration, and
   wherein the second shaped ion beam is applied to the second portion for a similar or different time duration.

7. The method of claim 6,
   wherein the first shaped ion beam is different in size from the second shaped ion beam.

8. The method of claim 1,
   wherein the first portion of the substrate and the second portion of the substrate have different corresponding etching rates, and
   wherein the applying of the first shaped ion beam and the applying of the second ion beam reduces the difference between the corresponding etching rates.

9. The method of claim 1,
   wherein the first portion of the substrate and the second portion of the substrate have the same corresponding etching rates, and
   wherein the applying of the first shaped ion beam and the applying of the second ion beam increases the difference between the corresponding etching rates.

10. The method of claim 1,
    wherein the first shaped ion beam parameter relates to an ion beam current distribution.

11. The method of claim 1, wherein the ion beam has an ion beam current distribution that comprises a center region between two outer regions, the method further comprising:
    wherein the shaping of the ion beam to form the first shaped ion beam comprises using the variable aperture to block at least one of the two outer regions from the shaped ion beam.

12. The method of claim 11,
    wherein the second shaped ion beam parameter relates to an ion beam current distribution.

13. The method of claim 12,
wherein the shaping of the ion beam to form the second shaped ion beam comprises using the variable aperture to block at least one of the two out regions from the shaped ion beam.

14. The method of claim 1,
wherein the shaping of the ion beam to form the first shaped ion beam comprises changing the size of a cross-section of the ion beam.

15. The method of claim 14,
wherein the shaping of the ion beam to form the second shaped ion beam comprises changing the size of a cross-section of the ion beam.

16. The method of claim 1,
wherein the shaping of the ion beam to form the first shaped ion beam comprises changing the shape of a cross-section of the ion beam.

17. The method of claim 16,
wherein the shaping of the ion beam to form the second shaped ion beam comprises changing the shape of a cross-section of the ion beam.

18. The method of claim 1,
wherein the first portion of the substrate has a set of uniform properties and the second portion of the substrate has a different set of uniform properties.

19. The method of claim 1,
wherein the first portion of the substrate has a first set of non-uniform properties and the second portion of the substrate has a second set of non-uniform properties, wherein the first and second set of non-uniform properties are not identical.

\* \* \* \* \*